(12) United States Patent
Milkie

(10) Patent No.: US 9,711,960 B2
(45) Date of Patent: Jul. 18, 2017

(54) BUILT-IN TEST CIRCUITS FOR TRANSIENT VOLTAGE PROTECTION DEVICES

(71) Applicant: Hamilton Sundstrand Corporation, Charlotte, NC (US)

(72) Inventor: Kenneth D. Milkie, W. Granby, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 66 days.

(21) Appl. No.: 14/699,571

(22) Filed: Apr. 29, 2015

(65) Prior Publication Data

US 2016/0322807 A1    Nov. 3, 2016

(51) Int. Cl.
*H02H 3/22* (2006.01)
*G01R 31/28* (2006.01)
*H02H 9/04* (2006.01)
*G01R 31/02* (2006.01)

(52) U.S. Cl.
CPC ........... *H02H 3/22* (2013.01); *G01R 31/2827* (2013.01); *H02H 9/041* (2013.01); *H02H 9/042* (2013.01); *G01R 31/024* (2013.01)

(58) Field of Classification Search
CPC .......... H02H 9/041; H02H 9/042; H02H 3/22; G01R 31/2827; G01R 31/024
See application file for complete search history.

(56) References Cited

U.S. PATENT DOCUMENTS

| 4,480,196 A | * | 10/1984 | Hinz | ................ H03K 17/08122 |
| | | | | 257/357 |
| 5,912,559 A | * | 6/1999 | Bortolini | ................ G01R 31/14 |
| | | | | 324/452 |
| 6,965,238 B2 | | 11/2005 | Rudholm et al. | |
| 8,059,378 B2 | | 11/2011 | Liu et al. | |
| 8,598,899 B2 | | 12/2013 | Hess | |
| 8,837,099 B2 | * | 9/2014 | Coln | ................... H01L 27/0255 |
| | | | | 361/56 |
| 2003/0235061 A1 | | 12/2003 | Park | |
| 2014/0306714 A1 | | 10/2014 | Hess et al. | |
| 2014/0340799 A1 | * | 11/2014 | Gray | ..................... H02H 9/041 |
| | | | | 361/56 |

FOREIGN PATENT DOCUMENTS

| DE | 102011012284 A1 | 8/2012 |
| EP | 2479860 A2 | 7/2012 |
| EP | 3002844 A1 | 4/2016 |

OTHER PUBLICATIONS

European Search Report from the European Patent Office dated Sep. 21, 2016 for Application No. EP16167629.

* cited by examiner

*Primary Examiner* — Zeev V Kitov
(74) *Attorney, Agent, or Firm* — Locke Lord LLP; Scott D. Wofsy; Christopher J. Cillié

(57) ABSTRACT

A transient voltage suppressor device includes a transient voltage suppression circuit, a first voltage monitor lead connected to the transient voltage suppression circuit, and a second voltage monitor lead connected to the transient voltage suppression circuit. A voltage injection circuit having a plurality of output voltage levels is also connected to the transient voltage suppression circuit to provide indication via the first and second voltage monitors if the transient voltage suppression circuit is shorted or open.

15 Claims, 4 Drawing Sheets

BUILT-IN TEST CIRCUITS FOR TRANSIENT VOLTAGE PROTECTION DEVICES

BACKGROUND OF THE INVENTION

1. Field of the Invention

The present disclosure relates to transient voltage protection devices, and more particularly to in-circuit testing of transient voltage protection devices.

2. Description of Related Art

Electrical systems commonly include transient voltage suppression (TVS) devices to protect electronic circuits from damage due to externally induced voltage transients. TVS devices are generally selected such that the do not conduct under normal operating conditions, and conduct when the voltage on the TVS device exceeds a turn-on voltage for the TVS device. The turn-on voltage of the TVS device is typically selected such that it is below the voltage rating of the electronic circuit protected by the TVS device. Some TVS devices may become unreliable during service by developing an open circuit or short circuit condition. This potentially reduces the protection ordinarily afforded by such TVS devices, and can leave the electronic circuit unprotected from voltage transients. While short circuits can sometimes be identified through observation of the protected electronic circuit, open circuit conditions can be more challenging to identify and correct. In some circumstances an open circuit condition in a TVS device may remain latent until the electronic circuit exhibits aberrant performance as a result of experiencing a voltage transient.

Such conventional methods and systems for protecting sensitive components within circuitry have generally been considered satisfactory for their intended purpose. However, there is still a need in the art for improved transient overvoltage protection systems that allow for improved protection device reliability. The present disclosure provides a solution for this need.

SUMMARY OF THE INVENTION

A transient voltage suppressor device includes a transient voltage suppression circuit, a first voltage monitor lead connected to the transient voltage suppression circuit, and a second voltage monitor lead connected to the transient voltage suppression circuit. A voltage injection circuit having a plurality of output voltage levels is also connected to the transient voltage suppression circuit to provide indication via the first and second voltage monitors if the transient voltage suppression circuit is shorted or open.

In certain embodiments, the transient voltage suppressor circuit can include a first diode and a second diode connected between source and return leads. The first diode can be connected in series with the second diode. The first diode can be connected to the second diode such that each diode opposes current flow in the same direction. For example, the first and second diodes can each be arranged such that no current flows from the source lead to the return lead when voltage is below a predetermined value. The first and second diodes can be Zener diodes, and the predetermined value can be the sum of the avalanche voltages of the diodes. A source disconnect switch can be connected between the voltage source lead and the transient voltage suppression circuit.

In accordance with certain embodiments, the voltage inject circuit can include a voltage source. The voltage source can include positive and negative voltage inject rails. The positive and negative voltage inject rails can be of unequal magnitudes relative to a ground reference. A voltage inject switch with three switch positions can be connected in series with the voltage source. In a switch first position, the voltage inject switch can connect a voltage inject circuit resistor with the positive voltage inject rail. In the switch second position, the voltage inject switch can connect the voltage inject resistor to the negative voltage inject rail. In the switch third position, the voltage inject circuit is disconnected from the voltage inject circuit resistor. It is contemplated that the voltage inject resistor can be connected to a voltage node interposed between the first and second diodes.

It is also contemplated that, in accordance with certain embodiments, the transient voltage suppression circuit can include a first resistor leg. The first resistor leg can be connected in parallel with the transient voltage suppression circuit and can include source and return resistors connected in series with one another. Each of the source and return resistors can have resistances, and the resistances can be equivalent to one another. A first resistance leg voltage node can be interposed between the source resistor and the return resistor, and the second voltage monitor lead can be connected to the first resistance leg voltage node. It is further contemplated that a second resistance leg can be connected in parallel with the first resistor leg between the source and return legs. The second resistance leg can have a resistor with a resistance that is less than the resistance of the resistors of the first resistance leg.

A transient voltage suppression system includes the transient voltage suppression circuit, first voltage monitor lead, second voltage monitor lead, and voltage inject circuit as described above. The system also includes a control module having a processor and memory that is operatively associated with the source disconnect switch, voltage inject circuit, and first and second voltage monitors that are coupled to the first and second voltage monitor leads. The memory has instructions recorded thereon that, when read by the processor, cause the processor to (a) determine if the first diode is shorted, (b) determine if the first diode is open, (c) determine if the second diode is shorted, and (d) determine if the second diode is open.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
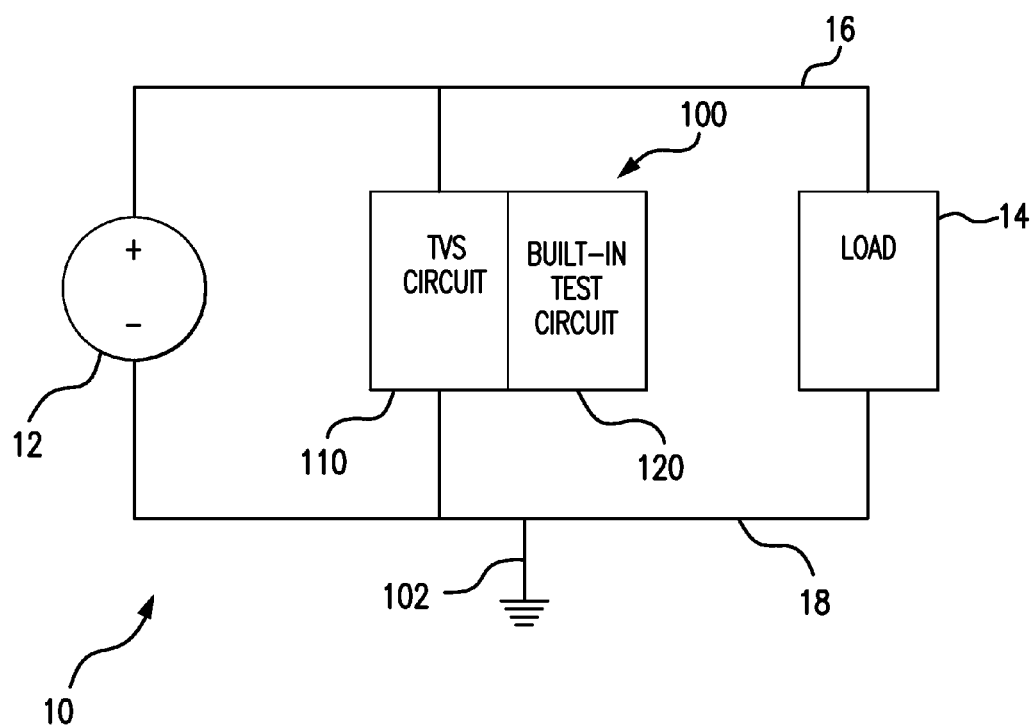
FIG. 1 is a schematic view of an exemplary embodiment of an electrical system constructed in accordance with the present disclosure, showing a transient voltage suppression and built-in test circuit connected between a voltage source and a load.

Reference will now be made to the drawings wherein like reference numerals identify similar structural features or aspects of the subject disclosure. For purposes of explanation and illustration, and not limitation, a partial view of an exemplary embodiment of a transient voltage suppression (TVS) device in accordance with the disclosure is shown in FIG. 1 and is designated generally by reference character 100. Other embodiments of TVS devices in accordance with the disclosure, or aspects thereof, are provided in FIGS. 2-4, as will be described. The systems and methods described herein can be used in power distribution systems and electronics devices, such as for marine, terrestrial and/or air vehicle electrical systems.

With reference to FIG. 1, an exemplary embodiment of an electrical system 10 is shown. Electrical system 10 includes a voltage source 12, a transient voltage suppression device 100, and an electrical load 14. A voltage source lead 16 interconnects a positive terminal of voltage source 12 with load 14, and a voltage return lead 18 interconnects a negative terminal of voltage source 12 with load 14. Transient voltage suppression device 100 is connected between voltage source lead 16 and voltage return lead 18, and includes a transient voltage circuit 110, a built-in test circuit 120, and a ground terminal 102.

Built-in test circuit 120 is connected to transient voltage circuit 110 for determining whether a fault exists within transient voltage suppression device 100, such as an open circuit or a short-circuit that could reduce the reliability of electrical system 10 of prevent dissipation of a transient voltage event. Non-limiting examples of transient voltage events include lightning strikes and arcing with certain types of loads, like motors.

Figure 2:
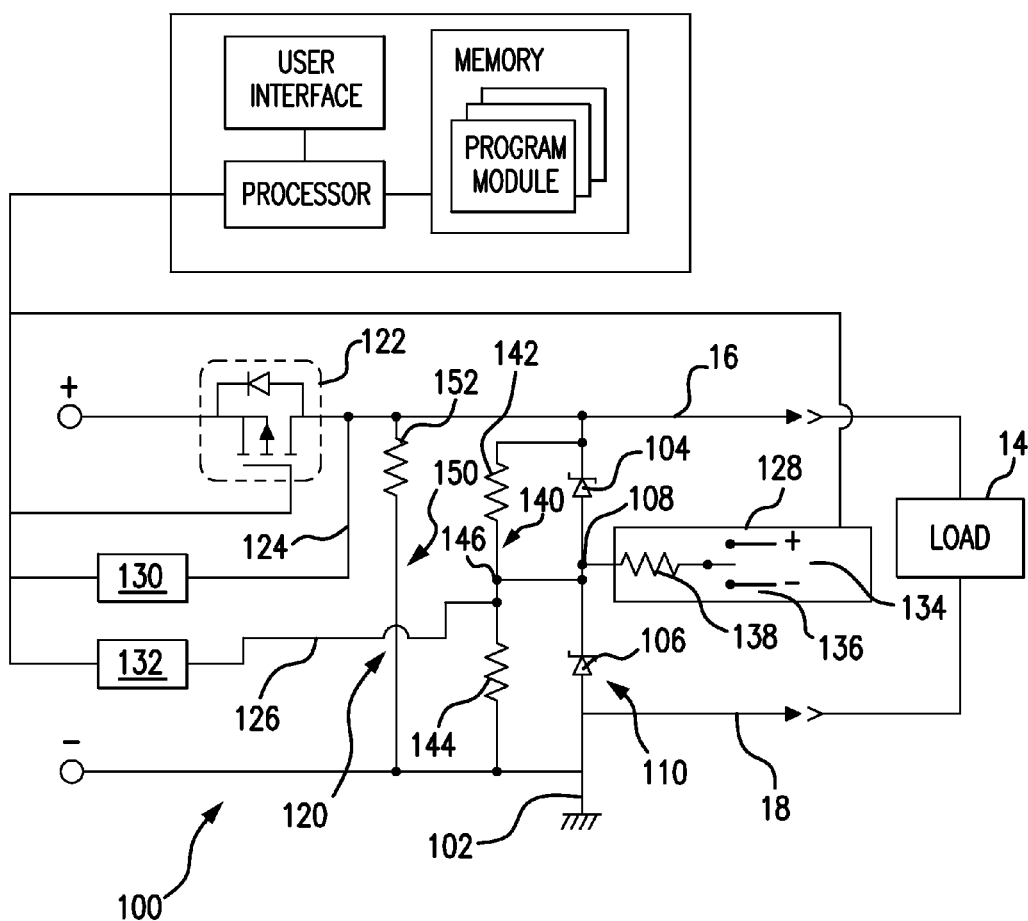
FIG. 2 is a circuit diagram of a transient voltage suppression circuit including a built-in test circuit according to an embodiment, showing a high-side source disconnect switch.

With reference to FIG. 2, transient voltage suppression device 100 is shown. Transient voltage suppression device 100 includes a first diode 104 connected to voltage source lead 16 and a second diode 106 connected to voltage return lead 18. First diode 104 and second diode 106 are connected in series with one another between voltage source lead 16 and voltage return lead 18. A voltage node 108 is interposed between first diode 104 and second diode 106, first diode 104 connecting to voltage node 108 on an end opposite voltage source lead 16 and second diode 106 connecting to voltage node 108 on an end opposite voltage return lead 18. Using a pair of diodes arranged in series instead of a single diode in the voltage protection circuit enables testing the diodes for both short and open conditions. While two diodes are illustrated in the illustrated exemplary transient voltage protection circuit, it is to be understood that voltage protection circuits with more than two diodes are also contemplated.

First diode 104 and second diode 106 are connected to one another in series between voltage source lead 16 and voltage return lead 18 such that both diodes oppose current flow from voltage source lead 16 and voltage return lead 18, i.e. with cathode ends of the diode facing voltage source lead 16. In embodiments, both first diode 104 and second diode 106 have avalanche (breakdown) voltages that are substantially equivalent to one another. For example, in an illustrative exemplary embodiment, voltage source 12 (shown in FIG. 1) includes a 28-volt source and first diode 104 and second diode 106 have avalanche voltages of about 40-volts. This renders TVS circuit suitable for use in aircraft power systems for purposes of dissipating transient voltages to ground, such as in lightning protection applications. In certain embodiments, first diode 104 and second diode 106 are Zener diodes.

Built-in test (BIT) circuit 120 includes a source disconnect switch 122, a first voltage monitor lead 124, a second voltage monitor lead 126, and a voltage inject circuit 128. Source disconnect switch 122 is connected to voltage source lead 16 between voltage source 12 (shown in FIG. 1) TVS circuit 110. Source disconnect switch 122 may include a solid-state switch, such as a field effect transistor (MOSFET) or insulated gate bipolar transistor (IGBT). As illustrated in FIG. 2, source disconnect switch 122 may be arranged as a high-side source disconnect switch.

Figure 3:
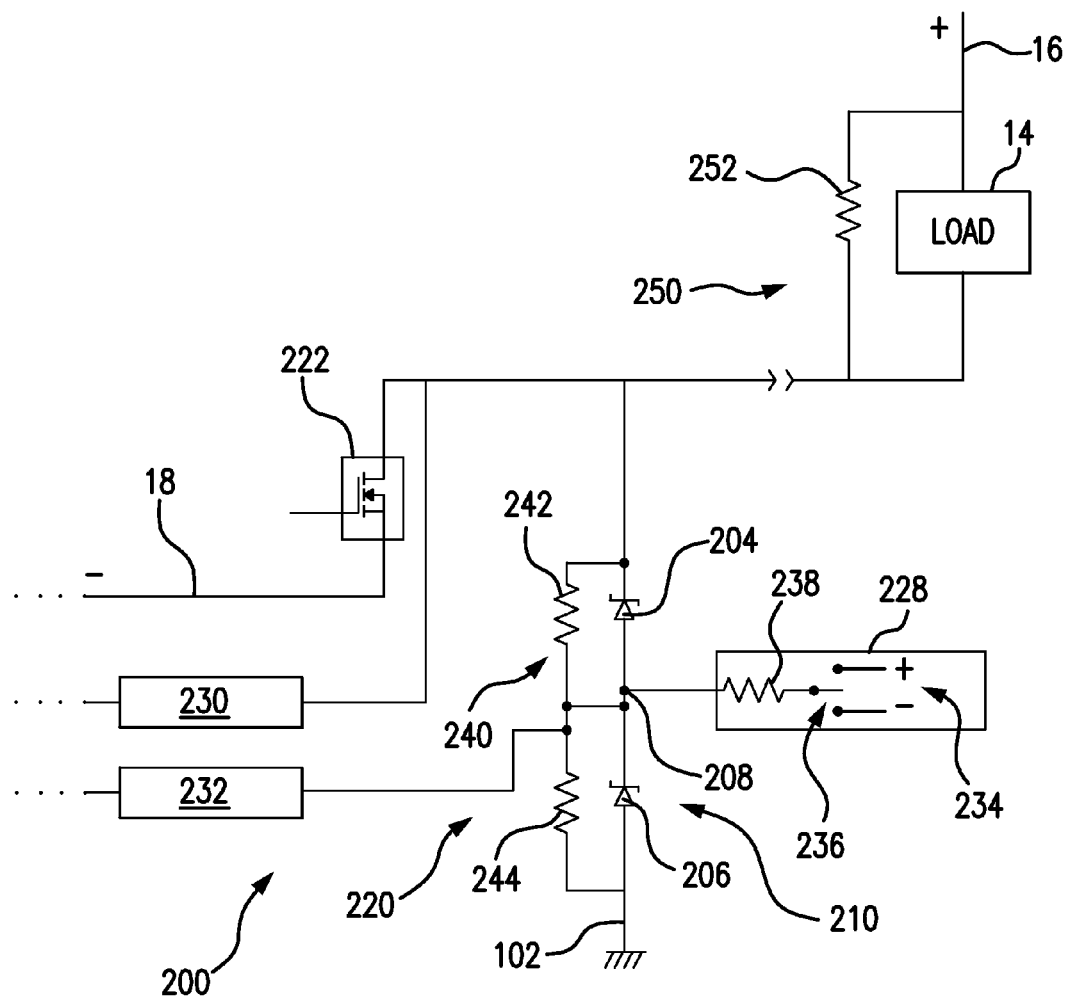
FIG. 3 is a circuit diagram another embodiment of a voltage suppression circuit including a built-in test circuit, showing a low-side source disconnect switch.

With reference to FIG. 3, another embodiment of transient voltage suppression device 200 is shown. Transient voltage suppression device 200 includes a TVS circuit 210 and BIT circuit 220. TVS circuit 210 is similar to TVS circuit 110 (shown in FIG. 2) and additionally includes a return disconnect switch 222 coupled to voltage return lead 18 and on a side of load 14 opposite source lead 16. BIT circuit 220 is similar to BIT circuit 120 (shown in FIG. 2).

With continuing reference to FIG. 2, first voltage monitor lead 124 is connected to voltage source lead 16 on a first end between source disconnect switch 122 and BIT circuit 120, and to a first voltage monitor 130 on an opposite second end. Second voltage monitor lead 126 is connected to voltage node 108 on a first end (i.e. between first diode 104 and second diode 106), and to a second voltage monitor 132 on an opposite second end. First voltage monitor 130 is used to measure voltage applied to load 14 (shown in FIG. 1). Second voltage monitor 132 is used to measure voltage applied to voltage node 108.

Voltage inject circuit 128 is used to apply a voltage potential to voltage node 108 and includes a voltage source 134, a voltage inject circuit switch 136, and voltage inject circuit resistor 138. Voltage source 134 includes positive and negative voltage inject rails, with respect to ground terminal 102, for injecting voltage for testing diodes of the transient voltage protection circuit, e.g. first diode 104 and second diode 106. Voltage inject circuit switch 136 is connected in series with voltage source 134 and voltage inject circuit resistor 138 is connected in series between voltage inject circuit switch 136 and voltage node 108. It is contemplated that the voltage positive and negative inject rails have magnitudes that are both high enough to forward bias either diode of the TVS circuit and which are below the avalanche voltage of the diode. In embodiments, magnitude of the positive and negative voltage inject rails is greater than about two (2) times forward voltage drop of the voltage protection circuit diodes and is less than the breakdown (avalanche) voltages of the voltage protection circuit diodes. This provides diagnostic capability for each of the diodes. In certain embodiments, the magnitude positive and negative voltage inject is about 10-volts for a 28-volt bus protected by two 40-volt diodes as illustrated in the exemplary circuit of FIG. 2.

Voltage inject circuit switch 136 and has three switch positions. In the switch first position, voltage inject circuit switch 136 connects voltage inject circuit resistor 138 with the positive voltage inject rail of voltage source 134. In the switch second position, voltage inject circuit switch 136 connects voltage inject circuit resistor 138 with the negative voltage inject rail of voltage source 134. In the switch third position, voltage inject circuit switch 136 is open and voltage source 134 of voltage inject circuit 128 is disconnected from voltage node 108.

BIT circuit 120 also includes a first resistor leg 140 and a second resistor leg 150. First resistor leg 140 is connected between voltage source lead 16 and voltage return lead 18, and is in parallel with second resistor leg 150. First resistor leg 140 includes a source-side resistor 142 connected in series with a return-side resistor 144 with a first leg voltage node 146 interposed between source-side resistor 142 and return-side resistor 144. Source-side resistor 142 and return-side resistor 144 have equivalent resistances, and second voltage monitor lead 126 is connected to first leg voltage node 146.

Second resistor leg 150 is connected between voltage source lead 16 and voltage return lead 18 such that it is parallel with first resistor leg 140. Second resistor leg 150 includes a second leg resistor 152 with a resistance that may be equal to the resistance of voltage inject circuit resistor 138 and smaller than respective resistances of source-side resistor 142 and return-side resistor 144. Second leg resistor 152 is also connected in parallel with load 14 such that, in a circuit having high resistance loads (or open loads), the functionality of the voltage protection circuit can still be tested due to the path to ground provided through second leg resistor 152.

In an exemplary embodiment, both voltage inject circuit resistor 138 and second leg resistor 152 have resistances of about 5 kilo ohms and source-side resistor 142 and return-side resistor 144 have resistances of about 100 kilo ohms. The positive rail of voltage source 134 has a voltage of about positive 10 volts and the negative rail of voltage source 134 has a voltage of about negative 10 volts. This enables BIT circuit 120 suitable for verifying the operability of TVS circuit with an 80-volt rating that is suitable for a 28-volt direct current power system. As will be appreciated, elements with other voltages and resistances may be used in other embodiments of devices described herein.

During normal operation, voltage inject circuit 128 is disconnected. When source disconnect switch 122 is closed, first voltage monitor 130 indicates the voltage applied to voltage source lead 16 by voltage source 12 (shown in FIG. 1). When source disconnect switch 122 is open, first voltage monitor 130 indicates zero (0) volts. During a transient voltage event, first diode 104 and second diode 106 limits voltage across source disconnect switch 122 and the controller module operatively associated therewith.

Figure 4:
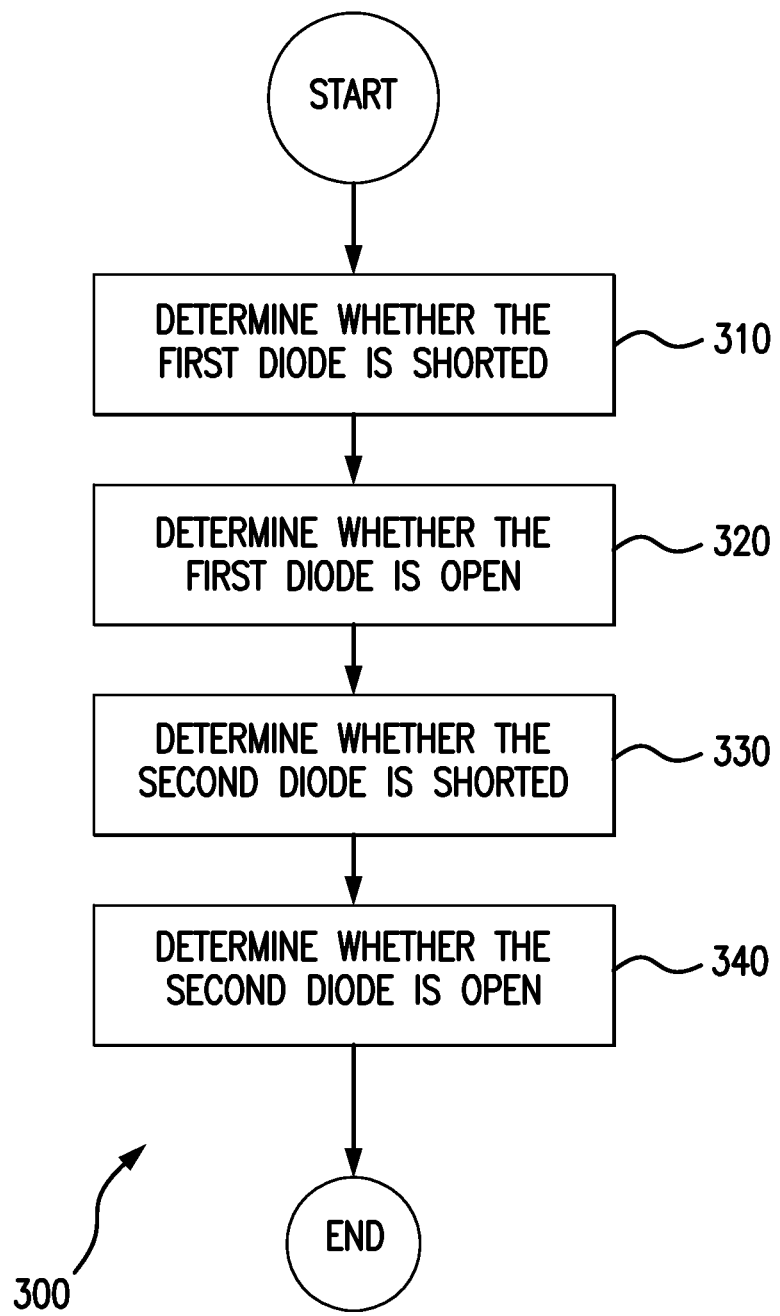
FIG. 4 is schematic view of an exemplary embodiment of a method of testing a transient voltage suppression device for open circuits and short circuits across diodes arranged in series within a transient voltage suppression circuit of the device.

With reference to FIG. 4, a method 300 of testing TVS circuit 110 using BIT circuit 120 is shown. Method 300 generally includes determining whether a first diode, e.g. first diode 104, is shorted, as shown with box 310. Method 300 also includes determining whether the first diode is open, as shown with box 320. Method 300 further includes determining whether a second diode, e.g. second diode 106, is shorted, as shown with box 330. Method 300 additionally includes determining whether the second diode is open, as shown with box 340. Each of these determinations are made by comparing voltage indications provided by first voltage monitor 130 and second voltage monitor 132 with switches of BIT circuit 120 in different switch positions.

For example, with reference to TVS circuit 110 and BIT circuit 120 shown in FIG. 2, when source disconnect switch 122 is closed and voltage inject circuit switch 136 is in the switch third position (i.e. the open position), voltage from a voltage source connected to source disconnect switch 122 is applied to first voltage monitor 130 and TVS circuit 110. Accordingly, first voltage monitor 130 should indicate the same voltage as voltage source 12, and second voltage monitor 132 should indicate about one-half of the voltage indicated by first voltage monitor 130. If so, this verifies that first diode 104 and second diode 106 are not shorted. Resistors 140 and 144 may be equal to each other, thereby forming a 2:1 voltage divider if neither of the first and second diodes are shorted.

With source disconnect switch 122 open and voltage inject circuit switch 136 in the switch third position, no voltage is applied to TVS circuit 110 and BIT circuit 120. Both first voltage monitor 130 and second voltage monitor 132 should read zero volts. This (a) verifies that first voltage monitor 130 and second voltage monitor 132 can accurately read a zero voltage, and (b) verifies that source disconnect switch 122 and voltage inject circuit switch 136 are functional.

With source disconnect switch 122 open and voltage inject circuit switch 136 in the switch first position, a positive voltage is applied to voltage node 108. First voltage monitor 130 and second voltage monitor 132 indicate respective voltages that are influenced by voltage inject circuit resistor 138, second leg resistor 152, load 14, and a voltage drop associated with first diode 104. If first diode 104 is not open, second voltage monitor 132 will indicate a voltage level that is more positive than a voltage indicated by first voltage monitor 130 by an amount that is equivalent to the forward voltage drop of first diode 104 (i.e. about one volt in the illustrated exemplary circuit). If first diode 104 is open, second voltage monitor 132 will indicate a voltage that is much greater than that indicated by first voltage monitor 130, e.g. about 10 volts in the illustrated exemplary circuit. When first voltage monitor 130 and second voltage monitor 132 indicate the equivalent voltages, first diode 104 is shorted.

With source disconnect switch 122 open and voltage inject circuit switch 136 in the switch second position, voltage from the negative voltage inject rail of voltage source 134 is applied to voltage node 108. First voltage monitor 130 should indicate zero volts. Second voltage monitor 132 should indicate a voltage that is equivalent to the forward voltage drop of second diode 106 (i.e. about negative one volt in the illustrated exemplary circuit). This verifies that second diode 106 is not open. In the event that second diode 106 is open, then second voltage monitor 132 will read a negative voltage with a magnitude that is larger than the forward voltage drop across second diode 106 (i.e. about negative ten volts in the illustrated exemplary circuit).

With reference to TVS circuit 210 and BIT circuit 220 shown in FIG. 3, when return disconnect switch 222 is open and voltage inject circuit switch 236 is in the switch third position, voltage from load 14 (and resistor 252 connected across the load) is applied to first voltage monitor 230 and TVS circuit 210. This causes first voltage monitor 230 to indicate a voltage that is the same as that voltage to voltage source lead 16. This also causes second voltage monitor 232 to indicate about one-half the voltage indicated by first voltage monitor 230 if neither first diode 204 nor second diode 206 are shorted. As will be appreciated, since first resistor 242 and second resistor 244 have equivalent resistance, the resistors form a 2:1 voltage divider when neither of the diodes of the TVS circuit are shorted.

When return disconnect switch 222 is closed and voltage inject circuit switch 236 is in the third switch position (open), no voltage is applied to voltage node 208, TVS circuit 210 and BIT circuit 220. Both first voltage monitor 230 and second voltage monitor 232 should indicate zero volts. If zero voltage is indicated on each, this verifies that (a) first voltage monitor 230 and second voltage monitor 232 can accurately read a zero voltage, and (b) return disconnect switch 222 and voltage inject circuit switch 236 are functional.

When return disconnect switch 222 is closed and voltage inject circuit switch 236 is in the switch first position, a positive voltage is applied to voltage node 208. This causes first voltage monitor 230 and second voltage monitor 232 to indicate voltages that are influenced by voltage inject circuit resistor 238 and a voltage drop associated with first diode 204. If first diode 204 is not open, second voltage monitor 232 will indicate a voltage level that is greater than the forward voltage drop of first diode 204 (i.e. about one volt in the illustrated exemplary circuit) relative to a voltage indicated by first voltage monitor 230. If first diode 204 is open, second voltage monitor 232 will indicate a voltage that is much greater than that indicated by first voltage monitor 230, e.g. about 10-volts in the illustrated exemplary circuit. When first voltage monitor 230 and second voltage monitor 232 indicate the same voltages first diode 204 is shorted.

When return disconnect switch 222 is closed and voltage inject circuit switch 236 is the switch second position, voltage from the negative voltage inject rail of voltage source 234 is applied to voltage node 208. If second diode 206 is not open, first voltage monitor 230 will indicate zero volts and second voltage monitor 232 will indicate a voltage that is equivalent to the forward voltage drop of second diode 206 (i.e. about negative one volt is the illustrated exemplary circuit). In the event that second diode 206 is open, second voltage monitor 232 will read a negative voltage with a magnitude that is of larger magnitude, e.g. about negative ten volts in the illustrated exemplary embodiment.

The methods and systems of the present disclosure, as described above and shown in the drawings, provide for transient voltage suppression devices with superior properties including improved reliability. In embodiments, currents associated with transient voltages only traverse the TVS circuit. In certain embodiments, detection of failed TVS circuit components can be detected while the TVS circuit protection devices are arranged in-circuit. It is also not necessary to include switches between the protected circuit and the transient protection devices (i.e. diodes) for purposes of isolating the devices for testing purposes. Since some types of switches can degrade in response to voltage stress from transient voltage events, this can improve the reliability of the TVS circuit by avoiding application of stresses on such interposed switches.

While the apparatus and methods of the subject disclosure have been shown and described with reference to preferred embodiments, those skilled in the art will readily appreciate that changes and/or modifications may be made thereto without departing from the scope of the subject disclosure. For example, groups of circuit elements from either or both of the BIT circuit and TVS circuit can be formed as discrete circuit elements, one or more integrated circuits, and/or a combination of software and firmware.

What is claimed is:

1. A transient voltage suppressor device, comprising:
    a transient voltage suppression (TVS) circuit;
    a first voltage monitor lead connected to the TVS circuit;
    a second voltage monitor lead connected to the TVS circuit; and
    a voltage injection circuit with a plurality of output voltage levels connected to the TVS circuit to provide indication via the voltage monitors if the TVS circuit is shorted or open,
    wherein the TVS circuit further includes a resistor leg connected in parallel with the TVS circuit, the resistor leg including a first resistor connected in series with a second resistor;
    wherein the resistor leg is a first resistor leg, and further including a second resistor leg connected in parallel with the first resistor leg.

2. A device as recited in claim 1, wherein the second resistor leg has a resistance that is less than a resistance of the first resistor leg.

3. A device as recited in claim 2, wherein the first resistor has a resistance that is equivalent to a resistance of the second resistor.

4. A device as recited in in claim 1, wherein the second voltage monitor lead is connected to a voltage node interposed between the first and second resistors and to the TVS circuit.

5. A transient voltage suppressor device, comprising:
    a transient voltage suppression (TVS) circuit;
    a first voltage monitor lead connected to the TVS circuit;
    a second voltage monitor lead connected to the TVS circuit; and
    a voltage injection circuit with a plurality of output voltage levels connected to the TVS circuit to provide indication via the voltage monitors if the TVS circuit is shorted or open,
    wherein the voltage inject circuit comprises a voltage inject circuit switch connected in series between a resistor and a voltage source,
    wherein the voltage inject switch is a three-position switch movable between a positive voltage inject rail, a negative voltage inject rail, and an open position.

6. A device as recited in claim 5, wherein the TVS circuit further includes a resistor leg connected in parallel with the TVS circuit, the resistor leg including a first resistor connected in series with a second resistor.

7. A device as recited in claim 6, wherein the voltage inject circuit comprises a voltage inject circuit switch connected in series between a resistor and a voltage source.

8. A device as recited in claim 6, wherein the TVS circuit further comprises a first diode and a second diode connected in series between voltage source and return leads.

9. A device as recited in claim 8, wherein the first and second diodes are both configured to oppose current flow from the source lead to the return lead.

10. A device as recited in claim 9, wherein the voltage injection circuit is connected to the TVS circuit at a voltage node interposed between the first and second diodes.

11. A device as recited in claim 10, wherein the second voltage monitor lead is connected at the voltage node interposed between the first and second diodes.

12. A device as recited in claim 7, further including a source disconnect switch connected in series with the TVS circuit.

13. A device as recited in claim 12, wherein the first voltage monitor lead is connected between the source disconnect switch and the TVS circuit.

14. A transient voltage suppressor system, comprising:
    a transient voltage suppression (TVS) circuit having first and second diodes arranged in series between source and return leads;
    a first voltage monitor lead connected to the TVS circuit between a source disconnect switch and the first diode;
    a second voltage monitor lead connect connected to the TVS circuit at a voltage node interposed between the first and second diodes;

a voltage injection circuit with a plurality of output voltage levels connected to the TVS circuit voltage; and a processor communicative with a memory and operative associated with the source disconnect switch, the voltage inject switch, first voltage monitor, and second voltage monitor, the memory having instructions recorded thereon that, when read by the processor, cause the processor to:

determine if the first diode is shorted;
determine if the first diode is open;
determine if the second diode is shorted; and
determine if the second diode is open.

15. A method of testing a transient voltage protection circuit, comprising:

determining if a first diode of a transient voltage protection circuit connected in series with a second diode of the transient voltage protection circuit between a source lead and a return lead is shorted;
determining if the first diode is open;
determining if the second diode is shorted; and
determining if the second diode is open.

* * * * *